(12) United States Patent
Sakakibara (10) Patent No.: US 10,739,410 B2
(45) Date of Patent: Aug. 11, 2020

(54) BATTERY CONTROL APPARATUS AND POWER SUPPLY SYSTEM

(71) Applicant: DENSO CORPORATION, Kariya, Aichi-pref. (JP)

(72) Inventor: Masahiro Sakakibara, Kariya (JP)

(73) Assignee: DENSO CORPORATION, Kariya (JP)

( * ) Notice: Subject to any disclaimer, the term of this patent is extended or adjusted under 35 U.S.C. 154(b) by 35 days.

(21) Appl. No.: 16/150,537

(22) Filed: Oct. 3, 2018

(65) Prior Publication Data
US 2019/0101596 A1  Apr. 4, 2019

(30) Foreign Application Priority Data
Oct. 3, 2017  (JP) .................... 2017-193836

(51) Int. Cl.
| | |
|---|---|
| *G01R 31/387* | (2019.01) |
| *H02J 7/00* | (2006.01) |
| *H01M 10/44* | (2006.01) |
| *G01R 31/396* | (2019.01) |
| *G01R 31/3835* | (2019.01) |
| *H02J 7/14* | (2006.01) |
| *G01R 31/392* | (2019.01) |
| *G01R 31/3828* | (2019.01) |
| *H01M 10/42* | (2006.01) |

(52) U.S. Cl.
CPC ....... *G01R 31/387* (2019.01); *G01R 31/3828* (2019.01); *G01R 31/3835* (2019.01); *G01R 31/392* (2019.01); *G01R 31/396* (2019.01); *H01M 10/441* (2013.01); *H02J 7/0014* (2013.01); *H02J 7/0021* (2013.01); *H02J 7/0024* (2013.01); *H02J 7/00036* (2020.01); *H02J 7/14* (2013.01); *H02J 7/1423* (2013.01); *H02J 7/1438* (2013.01); *H01M 2010/4271* (2013.01)

(58) Field of Classification Search
USPC ........................................... 320/118
See application file for complete search history.

(56) References Cited

U.S. PATENT DOCUMENTS

| | | | |
|---|---|---|---|
| 2007/0035273 A1* | 2/2007 | Kazama ............... | H02J 7/34 320/101 |
| 2010/0194339 A1* | 8/2010 | Yang .................... | H02J 7/0016 320/116 |

(Continued)

*Primary Examiner* — Mohammed Alam
(74) *Attorney, Agent, or Firm* — Oliff PLC (57) ABSTRACT

A battery control apparatus is applied to a power supply system that includes a storage battery including a plurality of battery cells, an electrical apparatus connected to the storage battery, and a cell monitoring apparatus connected to each battery cell of the storage battery. In the battery control apparatus, a total cell voltage calculating unit calculates a sum of the voltages of battery cells detected by a cell monitoring apparatus as a total cell voltage. A voltage acquiring unit acquires a voltage of the cell monitoring apparatus side of a resistor that is provided on a conduction path. A consumed current calculating unit calculates a consumed current that is consumed by the cell monitoring apparatus based on the total cell voltage and the voltage acquired by the voltage acquiring unit. A residual capacity calculating unit calculates the residual capacity based on the charge-discharge current and the consumed current.

8 Claims, 3 Drawing Sheets

(56) References Cited

U.S. PATENT DOCUMENTS

| | | | | |
|---|---|---|---|---|
| 2014/0152261 A1* | 6/2014 | Yamauchi | ........ | G01R 31/3835 |
| | | | | 320/118 |
| 2015/0069973 A1* | 3/2015 | Yoshida | ........ | B60L 58/21 |
| | | | | 320/118 |
| 2015/0318721 A1* | 11/2015 | Watanabe | ........ | H01M 10/441 |
| | | | | 320/118 |
| 2019/0101596 A1* | 4/2019 | Sakakibara | ........ | G01R 31/387 |

\* cited by examiner

BATTERY CONTROL APPARATUS AND POWER SUPPLY SYSTEM

CROSS-REFERENCE TO RELATED APPLICATION

This application is based on and claims the benefit of priority from earlier Japanese Patent Application No. 2017-193836, filed Oct. 3, 2017, the description of which is incorporated herein by reference.

BACKGROUND

Technical Field

The present disclosure relates to a battery control apparatus and a power supply system.

Related Art

Conventionally, an assembled battery (battery pack) in which numerous unit battery cells of a secondary battery are connected in series is used in hybrid cars, electric cars, and the like to ensure a desired voltage. In a power supply system that uses this assembled battery, the voltage of each unit battery cell is monitored using a cell controller. For example, in a battery cell monitoring apparatus described in JP-A-2015-112007, a voltage between terminals of each unit battery cell is detected and a cell balancing process is performed as required. At the same time, whether or not disconnection has occurred in a voltage detection line or the like is determined.

In the configuration in JP-A-2015-112007, the battery cell monitoring apparatus is operated by power supplied from a monitored storage battery. The battery cell monitoring apparatus monitors the inter-terminal voltage and the like. In this case, power is supplied from the monitored storage battery to the battery cell monitoring apparatus. Thus, the battery cell monitoring apparatus consumes current. As a result of the current consumption, calculation accuracy regarding battery residual capacity deteriorates.

SUMMARY

It is thus desired to provide a battery control apparatus that is capable of appropriately calculating a battery residual capacity and a power supply system.

A first exemplary embodiment provides a battery control apparatus that is applied to a power supply system. The power supply system includes: a storage battery that includes a plurality of battery cells; an electrical apparatus that is connected to the storage battery; and a cell monitoring apparatus that is connected to each battery cell of the storage battery and detects a voltage of each battery cell. The power supply system supplies power from the storage battery to the cell monitoring apparatus through a conduction path that is connected between the storage battery and the electrical apparatus.

The battery control apparatus calculates a residual capacity of the storage battery based on a charge-discharge current during charge-discharge of the storage battery. The battery control apparatus includes: a total cell voltage calculating unit that calculates a sum of the voltages of the battery cells detected by the cell monitoring apparatus as a total cell voltage; a voltage acquiring unit that acquires a voltage of the cell monitoring apparatus side of a resistor that is provided on the conduction path; a consumed current calculating unit that calculates a consumed current that is consumed by the cell monitoring apparatus based on the total cell voltage and the voltage acquired by the voltage acquiring unit; and a residual capacity calculating unit that calculates the residual capacity based on the charge-discharge current and the consumed current.

The electrical apparatus and the cell monitoring apparatus are connected to the storage battery. However, during calculation of the residual capacity, should the residual capacity of the storage battery be calculated while ignoring the current that flows to the conduction path, that is, the current that is consumed by the cell monitoring apparatus, an error in the residual capacity occurs as a result.

Therefore, according to the present exemplary embodiment, the resistor is provided on the conduction path between the storage battery and the cell monitoring apparatus. The consumed current that flows from the storage battery to the cell monitoring apparatus and is consumed by the cell monitoring apparatus is calculated by the voltage of the resistor on the cell monitoring apparatus side being acquired. In addition, the residual capacity of the storage battery is calculated based on the consumed current and the charge-discharge current. As a result, a more accurate residual capacity can be calculated.

The battery control apparatus may be operated by power supplied from the storage battery, and may be connected to a branching path that branches off from the conduction path between the resistor and the cell monitoring apparatus.

As a result of power being supplied to the battery control apparatus over the branching path that branches off between the resistor and the cell monitoring apparatus, the consumed current that flows to the battery control apparatus and is consumed by the battery control apparatus can be detected by the resistor together with the consumed current that flows to the cell monitoring apparatus and is consumed by the cell monitoring apparatus. Therefore, even when power is supplied from the storage battery to the battery control apparatus, the residual capacity of the storage battery can be accurately calculated.

In the battery control apparatus, the power supply system may include a first storage battery that serves as the storage battery and a second storage battery other than the first storage battery. The first storage battery and the second storage battery are connected to the cell monitoring apparatus. The battery control apparatus may include a first switch, a second switch, and a switch control unit. The first switch is provided between the first storage battery and the cell monitoring apparatus. The second switch is provided between the second storage battery and the cell monitoring apparatus. The switch control unit that controls opening and closing of the first switch and the second switch based on a state of charge of at least either of the first storage battery and the second storage battery during a monitoring operation by the cell monitoring apparatus.

As a result of power being supplied to the cell monitoring apparatus from the first storage battery and the second storage battery, reliability of the cell monitoring apparatus is improved due to redundancy of the power supply. In addition, as a result of two storage batteries being used together, an amount of use of the first storage battery can be reduced. Furthermore, power supply to the cell monitoring apparatus can be switched between power supply from the first storage battery, power supply from the second storage battery, and power supply from both storage batteries, based on the state of charge of at least either of the first storage battery and the second storage battery.

The battery control apparatus may include an abnormality determining unit that determines whether or not an abnormality has occurred in the first storage battery based on monitoring results from the cell monitoring apparatus, during the monitoring operation by the cell monitoring apparatus. The switch control unit opens the first switch and closes the second switch when the abnormality determining unit detects an abnormality.

When an abnormality occurs in the first storage battery, power supply from the first storage battery to the cell monitoring apparatus is stopped by the first switch being opened. Meanwhile, power is supplied from the second storage battery to the cell monitoring apparatus by the second switch being closed. In this way, even when an abnormality occurs in the first storage battery, power can be supplied from the second storage battery. The cell monitoring apparatus can continue to monitor the state of the first storage battery.

A second exemplary embodiment provides a power supply system that includes: a first storage battery that includes a plurality of battery cells; a cell monitoring apparatus that is connected to each battery cell of the first storage battery and detects a voltage of each battery cell; and a battery control apparatus to which power is supplied from a second storage battery other than the first storage battery, the battery control apparatus calculating a residual capacity of the first storage battery based on a charge-discharge current during charge-discharge to an electrical apparatus that is connected to the first storage battery. The first storage battery is connected to the cell monitoring apparatus and the battery control apparatus via a resistor that is provided on a conduction path that branches off from an electrical path to the electrical apparatus.

The battery control apparatus includes: a total cell voltage calculating unit that calculates a sum of the voltages of the battery cells detected by the cell monitoring apparatus as a total cell voltage; a voltage acquiring unit that acquires a voltage of the resistor on the cell monitoring apparatus side; a consumed current calculating unit that calculates a consumed current that is consumed by the cell monitoring apparatus and the battery control apparatus based on a difference between the total cell voltage and the voltage acquired by the voltage acquiring unit; and a residual capacity calculating unit that calculates the residual capacity based on the charge-discharge current and the consumed current.

Power is supplied from the first storage battery to the cell monitoring apparatus and the battery control apparatus. However, when the charge-discharge current is detected during charge-discharge to the electrical apparatus, the current flowing to the conduction path that branches off from the electrical path between the storage battery and the electrical apparatus cannot be detected. However, when the residual capacity of the storage battery is calculated while ignoring the current that flows to the conduction path, that is, the current consumed by the cell monitoring apparatus and the battery control apparatus, an error in the residual capacity occurs as a result.

Therefore, in the present exemplary embodiment, the resistor is provided on the conduction path between the storage battery, and the cell monitoring apparatus and the battery control apparatus. The consumed current that flows from the storage battery to the cell monitoring apparatus and the battery control apparatus and is consumed by the cell monitoring apparatus and the battery control apparatus is calculated by the voltage of the resistor on the cell monitoring apparatus side being acquired. In addition, the residual capacity of the storage battery is calculated based on the consumed current and the charge-discharge current. As a result, a more accurate residual capacity can be calculated. Furthermore, as a result of power being supplied to the battery control apparatus from both the first storage battery and the second storage battery, power supply to the battery control apparatus can be made redundant. Reliability of the battery control apparatus is improved.

In the power supply system, the first storage battery and the second storage battery may be connected to the cell monitoring apparatus. The battery control apparatus may include a first switch, a second switch, and a switch control unit. The first switch is provided between the first storage battery and the cell monitoring apparatus. The second switch is provided between the second storage battery and the cell monitoring apparatus. The switch control unit controls opening and closing of the first switch and the second switch based on a state of charge of at least either of the first storage battery and the second storage battery during a monitoring operation by the cell monitoring apparatus.

DESCRIPTION OF THE EMBODIMENTS

An embodiment implementing the present disclosure will be described with reference to the drawings. According to the present embodiment, a power supply system that supplies power to various apparatuses of a vehicle that drives using an engine (internal combustion engine) as a drive source is implemented.

Figure 1:
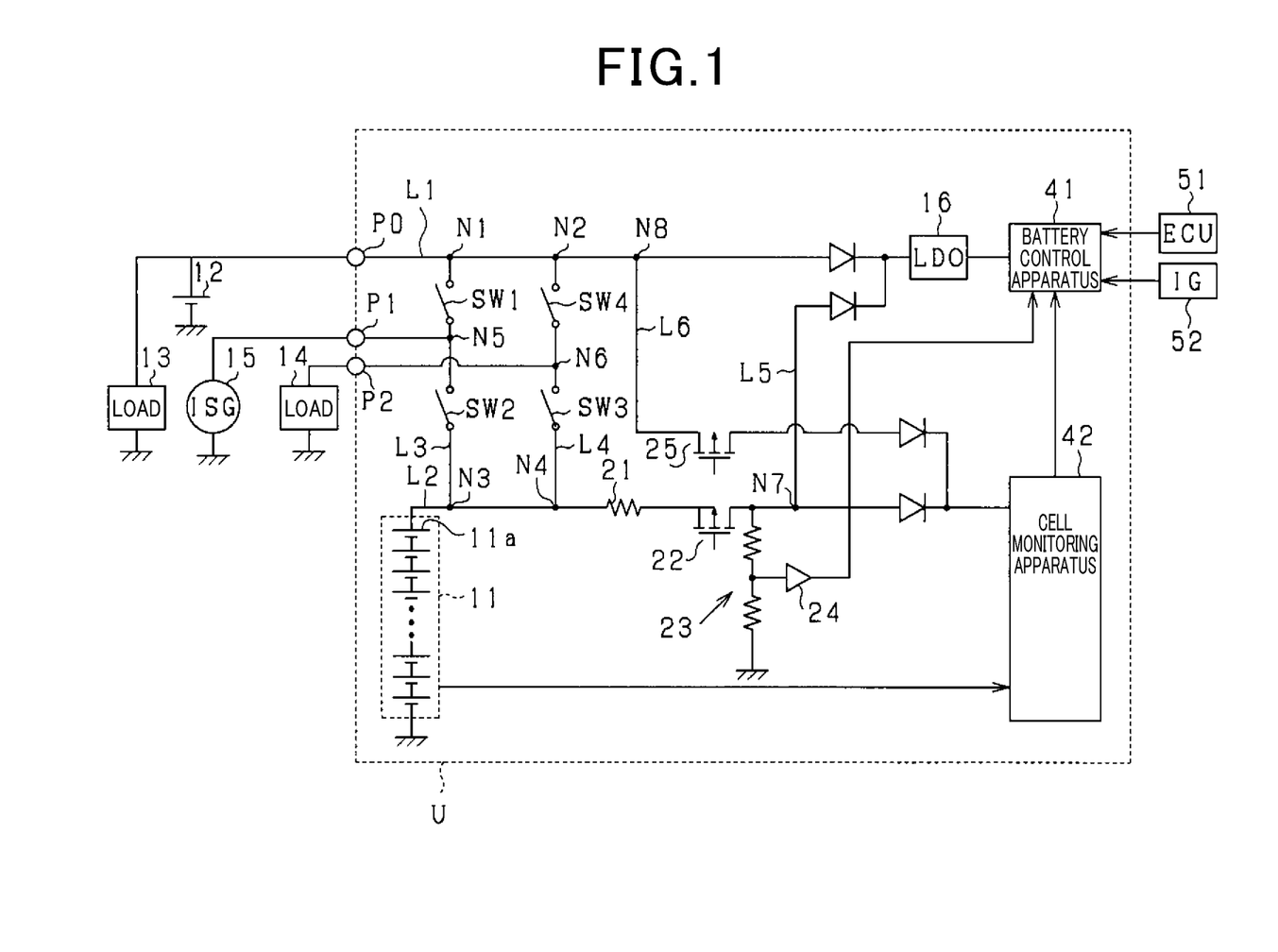
FIG. 1 is a schematic diagram of a power supply system.

As shown in FIG. 1, the power supply system includes a lithium-ion storage battery 11 and a lead storage battery 12. The lithium-ion storage battery 11 serves as a "first storage battery." The lead storage battery 12 serves as a "second storage battery." The power supply system is a so-called dual power supply system. The storage batteries 11 and 12 are capable of supplying power to various electrical loads 13 and 14, and a rotating electric machine 15. In addition, the rotating electric machine 15 charges the storage batteries 11 and 12.

The lead storage battery 12 is a known general-purpose storage battery. Meanwhile, the lithium-ion storage battery 11 is a high-density storage battery that has lower power loss during charge and discharge, and higher output density and energy density, compared to the lead storage battery 12. The lithium-ion storage battery 11 is preferably a storage battery that has higher energy efficiency during charge and discharge, compared to the lead storage battery 12. In addition, the lithium-ion storage battery 11 is configured as an assembled battery (battery pack) that is composed of a plurality of battery cells 11a that are connected in series. The storage batteries 11 and 12 have substantially the same rated voltage. For example, the rated voltage is 12 V.

A detailed description with reference to FIG. 1 will be omitted. The lithium-ion storage battery 11 is configured as a battery unit U that is housed in a housing case and integrated with a base plate (board). In FIG. 1, the battery unit U is surrounded by a broken line. The battery unit U has external terminals P0, P1, and P2. The lead storage battery 12 and the electrical load 13 are connected to the external terminal P0, among the external terminals P0, P1, and P2. The rotating electric machine 15 is connected to the external terminal P1. The electrical load 14 is connected to the external terminal P2.

The electrical loads 13 and 14 differ in terms of a required voltage of the power supplied from the storage batteries 11 and 12. Of the electrical loads 13 and 14, the electrical load 14 includes a constant-voltage-required load that requires the voltage of the supplied power to be fixed or at least stable such that the voltage varies within a predetermined range. Meanwhile, the electrical load 13 is a typical electrical load other than the constant-voltage-required load. The electrical load 14 may also be considered to be a protected load. In addition, it can also be said that the electrical load 14 is a load that does not tolerate power supply failure, and the electrical load 13 is a load that tolerates power supply failure in comparison to the electrical load 14.

The rotating electric machine 15 is a power generator that also provides the functions of a motor. The rotating electric machine 15 includes a three-phase alternating-current motor and an inverter that serves as a power conversion apparatus. The rotating electric machine 15 is configured as an electromechanically integrated starter generator (ISG). The rotating electric machine 15 provides a power generation function in which power generation (regenerative power generation) is performed through rotation of an engine output shaft and an axle. The rotating electric machine 15 also provides a powering function in which rotational force is applied to the engine output shaft. The rotating electric machine 15 supplies the generated power to the storage batteries 11 and 12, and the electrical loads 13 and 14.

The battery unit U is provided with a battery control apparatus 41. The battery control apparatus 41 calculates a state of charge (SOC) (residual capacity) of the lithium-ion storage battery 11 and performs various types of control of the battery unit U. The battery control apparatus 41 is configured by a microcomputer that includes a central processing unit (CPU), a read-only memory (ROM), a random access memory (RAM), an input/output interface, and the like.

An electronic control unit (ECU) 51 is connected to the battery control apparatus 41. The ECU 51 serves as a control apparatus that is outside the battery unit. The battery control apparatus 41 and the ECU 51 are connected by a communication network (communication line) such as a controller area network (CAN) and are capable of communicating with each other. The battery control apparatus 41 and the ECU 51 are capable of sharing various types of data stored in the battery control apparatus 41 and the ECU 51.

The ECU 51 serves as a higher-order control apparatus in relation to the battery control apparatus 41. The ECU 51 outputs various commands to the battery control apparatus 41 based on charge states of the storage batteries 11 and 12, a driving state of the vehicle, and the like. The battery control apparatus 41 then performs various types of control of the battery unit U based on the commands.

Here, the battery control apparatus 41 is started by a startup signal being inputted from outside the battery unit U or a command from the ECU 51. Specifically, the battery control apparatus 41 is started when an isolated ground (IG) circuit 52 is turned on and an IG signal becomes on. Other control apparatuses such as the ECU 51 are similarly started in accompaniment with the IG signal becoming on. Communication between the control apparatuses become possible in accompaniment with startup of the control apparatuses. In addition, even when the IG signal is off, some of the functions of the ECU 51 and the like are enabled, and the battery control apparatus 41 is started by a command from the ECU 51.

In addition, the battery unit U is provided with a cell monitoring apparatus 42. The cell monitoring apparatus 42 monitors the lithium-ion storage battery 11. The cell monitoring apparatus 42 is provided with a known voltage detection circuit and a known equalization circuit. The voltage detection circuit detects the voltage of each battery cell 11a. The equalization circuit performs a cell balancing process to perform equalization process for the battery cells 11a when a difference is present among the detection voltages of the battery cells 11a. Information on the lithium-ion storage battery 11, such as the voltages detected by the cell monitoring apparatus 42, is transmitted as appropriate to the battery control apparatus 41.

Next, an electrical configuration of the battery unit U will be described with reference to FIG. 1. The battery unit U is provided with an electrical path L1 and an electrical path L2 as electrical circuits within the battery unit U. The electrical path L1 connects the external terminal P0 to which the lead storage battery 12 is connected and the battery control apparatus 41. The electrical path L2 connects the lithium-ion storage battery 11 and the cell monitoring apparatus 42.

In addition, the battery unit U is provided with an electrical path L3 and an electrical path L4. The electrical path L3 connects a connection point N1 on the electrical path L1 and a connection point N3 on the electrical path L2. The electrical path L3 has a connection point N5 that branches off to the external terminal P1. The electrical path L4 connects a connection point N2 on the electrical path L1 and a connection point N4 on the electrical path L2. The electrical path L4 has a connection point N6 that branches off to the external terminal P2.

A switch SW1 is provided between the connection point N1 and the connection point N5 on the electrical path L3. A switch SW2 is provided between the connection point N3 and the connection point N5. The generated power from the rotating electric machine 15 is supplied to the lead storage battery 12 via the connection point N5, the electrical path L3, the connection point N1, and the electrical path L1. The generated power from the rotating electric machine 15 is supplied to the lithium-ion storage battery 11 via the connection point N5, the electrical path L3, the connection point N3, and the electrical path L2.

In addition, a switch SW3 is provided between the connection point N4 and the connection point N6 on the electrical path L4. A switch SW4 is provided between the connection point N2 and the connection point N6. Power can be supplied from the lithium-ion storage battery 11 to the electrical load 14 via the electrical path L2, the connection point N4, the electrical path L4, and the connection point N6. In addition, power can be supplied from the lead storage battery 12 to the electrical load 14 via the electrical path L1, the connection point N2, the electrical path L4, and the connection point N6.

Each of the switches SW1 to SW4 includes a pair of semiconductor switches (not shown). The semiconductor switch is a metal-oxide-semiconductor field-effect transistor (MOSFET). The pair of MOSFETs is connected in series such that respective parasitic diodes are in opposite directions. In the switches SW1 to SW4, a plurality of pairs of MOSFETs may be provided and connected in parallel.

In addition, in the switches SW1 to SW4, an insulated-gate bipolar transistor (IGBT), a bipolar transistor, or the like may be used instead of the MOSFET. The battery control apparatus 41 performs on/off control of the switches SW1 to SW4. In addition, each of the switches SW1 to SW4 is provided with a current detection circuit or a current detector that detects the current flowing to each of the switches SW1 to SW4. The current detected at each of the switches SW1 to SW4 serves as a current value of a charge-discharge current during charge-discharge of the storage batteries 11 and 12 and is outputted to the battery control apparatus 41.

During charge-discharge of the lithium-ion storage battery 11, the charge-discharge current flows from the electrical path L2 of the battery unit U and branches off at the connection point N3 to the electrical path L3. In addition, the charge-discharge current flows from the electrical path L2 and branches off at the connection point N4 to the electrical path L4. That is, power can be supplied from the lithium-ion storage battery 11 to the cell monitoring apparatus 42 over the electrical path L2 that is connected between the lithium-ion storage battery 11, the electrical loads 13 and 14, and the rotating electric machine 15.

A shunt resistor 21 (corresponding to a "resistor") is provided between the connection point N4 and the cell monitoring apparatus 42 on the electrical path L2. A lithium-ion storage battery switch 22 (hereinafter referred to as a "lithium battery switch 22") (corresponding to a "first switch") is provided between the shunt resistor 21 and the cell monitoring apparatus 42 on the electrical path L2. The lithium battery switch 22 is a normally open switch and configured by a semiconductor switch such as a MOSFET. The lithium battery switch 22 is closed by an on signal and opened by an off signal from the battery control apparatus 41.

In addition, an electrical path L5 (corresponding to a "branching path") is connected to a connection point N7 between the lithium battery switch 22 and the cell monitoring apparatus 42 on the electrical path L2. A diode is provided on the electrical path L5. Power can be supplied from the lithium-ion storage battery 11 to the battery control apparatus 41 over the electrical path L5. In addition, a diode is provided on the electrical path L2. Power can be supplied from the lithium-ion storage battery 11 to the cell monitoring apparatus 42 over the electrical path L2.

Furthermore, a voltage divider circuit 23 is connected between the lithium battery switch 22 and the connection point N7 on the electrical path L2. A voltage divided by the voltage divider circuit 23 is amplified by an operational amplifier 24 and outputted to the battery control apparatus 41. A voltage at the connection point between the voltage divider circuit 23 and the electrical path L2 serves as a voltage on the cell monitoring apparatus 42 side of the shunt resistor 21 that is provided between the connection point N4 (a branching point to the electrical path L4 that supplies power to the electrical load 14) and the connection point N7 (a branching point to the electrical path L5 that supplies power to the battery control apparatus 41).

That is, the shunt resistor 31 can be provided on a conduction path between the lithium-ion storage battery 11, and the cell monitoring apparatus 42 and the battery control apparatus 41. The voltage of the shunt resistor 21 on the cell monitoring apparatus 42 side can be detected and outputted to the battery control apparatus 41.

Meanwhile, an electrical path L6 is connected to a connection point N8 between the connection point N2 and the battery control apparatus 41 on the electrical path L1. A lead storage battery switch 25 (hereinafter referred to as a "lead battery switch 25") (corresponding to a "second switch") and a diode are provided on the electrical path L6. The lead battery switch 25 is a normally open switch and configured by a semiconductor switch such as a MOSFET. The lead battery switch 25 is closed by an on signal and opened by an off signal from the battery control apparatus 41. Power can be supplied from the lead storage battery 12 to the cell monitoring apparatus 42 over the electrical path L6.

Meanwhile, a diode is provided on the electrical path L1. Power can be supplied from the lead storage battery 12 to the battery control apparatus 41 over the electrical path L2. In addition, a low dropout (LDO) regulator 16 is provided on the electrical path L1. Constant-voltage power can be supplied to the battery control apparatus 41 by the LDO regulator 16.

Figure 2:
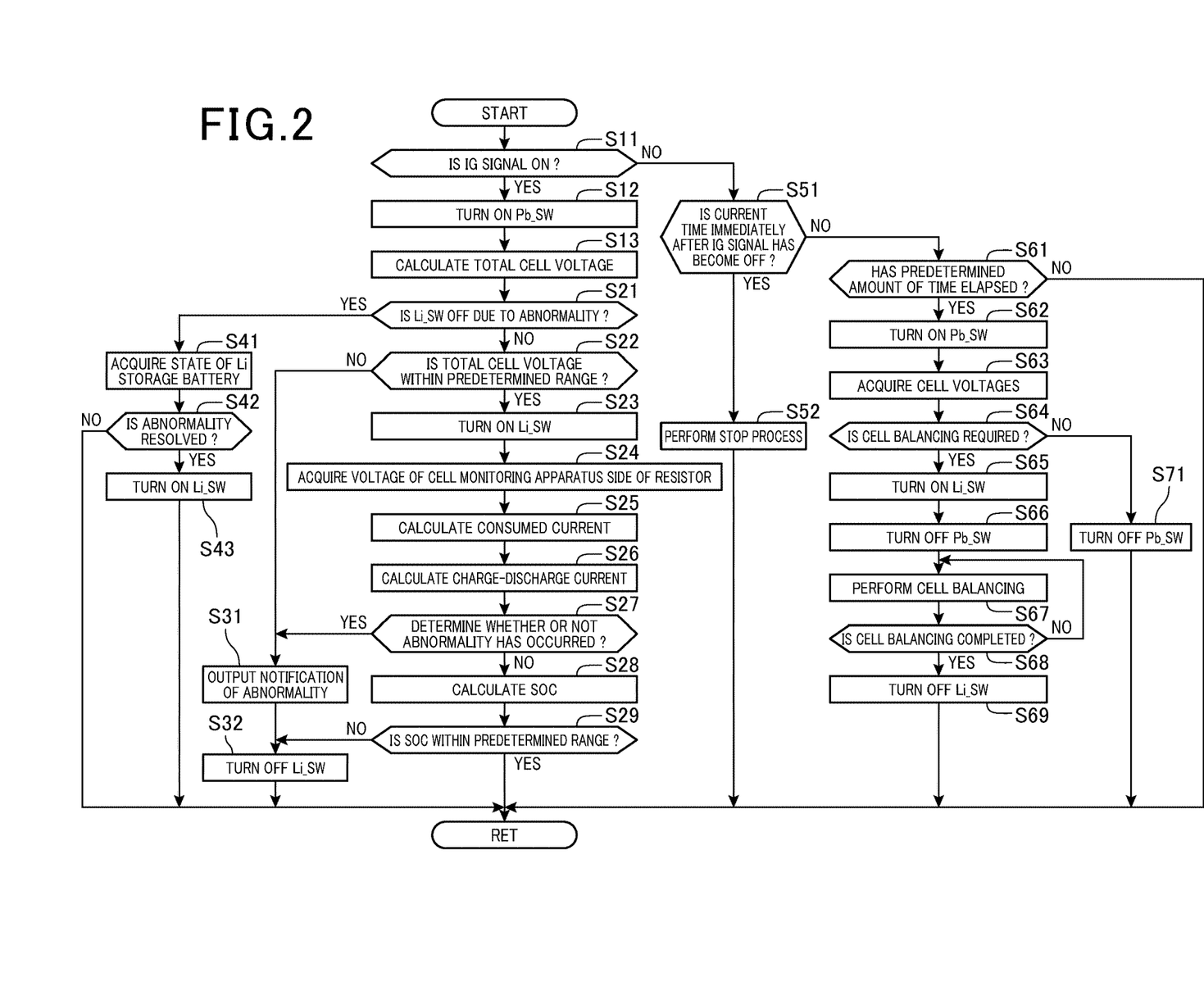
FIG. 2 is a flowchart of the steps in a process performed by a battery control apparatus.

FIG. 2 is a flowchart of the steps in a process performed by the battery control apparatus 41 in the battery unit U. The battery control apparatus 41 repeatedly performs this process at a predetermined period (cycle).

In FIG. 2, at step S11, the battery control apparatus 41 determines whether or not the IG signal that is a startup signal is on. The IG signal being on indicates that the engine is operating. When determined that the IG signal is on (YES at step S11), the battery control apparatus 41 proceeds to step S12. When determined that the IG signal is off (NO at step S11), the battery control apparatus 41 proceeds to step S51.

When determined that the IG signal is on (YES at step S11), at step S12, the battery control apparatus 41 turns on the lead battery switch 25 (Pb_Sw) when the IG signal is changed to on. When the lead battery switch 25 is turned on, power is supplied from the lead storage battery 12 to the cell monitoring apparatus 42 via the electrical path L1, the connection point N8, the electrical path L6, and the electrical path L2. When the IG signal becomes on, the battery control apparatus 41 is started. In addition, power is supplied from the lead storage battery 12 to the battery control apparatus 41 via the electrical path L1.

When power is supplied from the lead storage battery 12 to the cell monitoring apparatus 42 and the cell monitoring apparatus 42 is started, at step S13, the battery control apparatus 41 calculates a total cell voltage of the lithium-ion storage battery 11. Specifically, an inter-terminal voltage of each battery cell 11a is measured by the voltage detection circuit in the cell monitoring apparatus 42. Then, the battery control apparatus 41 calculates a sum of the voltages of the battery cells 11a as a total cell voltage of the lithium-ion storage battery 11.

At this time, when charge-discharge of the lithium-ion storage battery 11 is not being performed, such as during startup of the cell monitoring apparatus 42, the cell monitoring apparatus 42 measures an open circuit voltage (OCV). When charge-discharge of the lithium-ion storage battery 11 is being performed, the cell monitoring apparatus 42 measures a closed circuit voltage (CCV). A function provided at this step S13 corresponds to a "total cell voltage calculating unit."

At step S21, the battery control apparatus 41 determines whether or not the lithium battery switch 22 (Li_Sw) is in an off state due to an abnormality. Specifically, the battery control apparatus 41 determines YES at step S21 (i.e., the lithium battery switch 22 is in an off state due to an abnormality) when determined NO at step S22 (i.e., the total cell voltage is outside of a predetermined range), YES at step S27 (i.e., an abnormality has occurred in the lithium-ion storage battery 11), or NO at step S29 (i.e., the SOC is outside of a predetermined range), described hereafter, in a processing flow of a previous period (cycle). That is, when the lithium battery switch 22 is in the off state at step S32, the battery control apparatus 41 determines YES at step S21 (i.e., the lithium battery switch 22 is in an off state due to an abnormality).

When determined NO at step S21 (i.e., the lithium battery switch 22 is not in an off state due to an abnormality), the battery control apparatus 41 proceeds to step S22. At step S22, the battery control apparatus 41 determines whether or not the total cell voltage calculated at step S13 is within a predetermined range. When determined that the total cell voltage is within the predetermined range (YES at step S22), the battery control apparatus 41 proceeds to step S23. When determined that the total cell voltage is outside of the predetermined range (NO at step S22), the battery control apparatus 41 proceeds to step S31.

At step S23, the battery control apparatus 41 turns on the lithium battery switch 22. When the lithium battery switch 22 is turned on, power is supplied from the lithium-ion storage battery 11 to the cell monitoring apparatus 42 via the electrical path L2. That is, the cell monitoring apparatus 42 can receive power supply from both the lithium-ion storage battery 11 and the lead storage battery 12.

Then, at step S24, the battery control apparatus 41 acquires a voltage of the cell monitoring apparatus 42 side of the shunt resistor 21. Specifically, the battery control apparatus 41 acquires the voltage that has been divided by the voltage divider circuit 23 and amplified by the operational amplifier 24. A function provided at step S24 corresponds to a "voltage acquiring unit."

At step S25, the battery control apparatus 41 calculates consumed power based on the voltage acquired at step S24. The battery control apparatus 41 determines a value that amounts to a voltage drop in the shunt resistor 21 by subtracting the value of the voltage of the shunt resistor 21 on the cell monitoring apparatus 42 side from the value of the total cell voltage calculated at step S13. Then, the battery control apparatus 41 can determine the current flowing to the shunt resistor 21, that is, the current consumed by the battery control apparatus 41 and the cell monitoring apparatus 42 by multiplying the value that amounts to the voltage drop in the shunt resistor 21 by the value of the shunt resistor 21. In this way, as a result of the voltage of the shunt resistor 21 on the lithium-ion storage battery 11 side being the value of the total cell voltage, a configuration for detecting voltage is not required to be provided on the lithium-ion storage battery 11 side of the shunt resistor 21. The circuit can be simplified. A function provided at step S25 corresponds to a "consumed current calculating unit."

At step S26, the battery control apparatus 41 acquires values of the currents flowing to the switches SW1 to SW4 and calculates a charge-discharge current based on the current values. Here, the battery control apparatus 41 may not acquire the current values of the currents flowing to the switches SW1 to SW4. Rather, the cell monitoring apparatus 42 may acquire the current values and output the current values to the battery control apparatus 41.

At step S27, the battery control apparatus 41 determines whether or not an abnormality has occurred in the lithium-ion storage battery 11. For example, when the voltage of the battery cells 11a monitored by the cell monitoring apparatus 42 is in an overcharge state or an over-discharge state, the battery control apparatus 41 determines that an abnormality has occurred and determines YES at step S27.

In addition, when the current that flows between the lithium-ion storage battery 11 and the electrical load 14 or the rotating electric machine 15 is excessively large based on the values of the currents flowing to the switches SW1 to SW4, the battery control apparatus 41 determines that an abnormality has occurred and determines YES at step S27.

Furthermore, when the battery control apparatus 41 or the cell monitoring apparatus 42 detects a temperature of the lithium-ion storage battery 11, and when an abnormality occurs in the lithium-ion storage battery 11, such as the temperature falling outside of a predetermined range, the battery control apparatus 41 determines YES at step S27. Functions provided at step S22 and step S27 correspond to an "abnormality determining unit."

When determined NO at step S27 (i.e., an abnormality has not occurred in the lithium-ion storage battery 11), at step S28, the battery control apparatus 41 calculates the SOC using a known method. For example, the battery control apparatus 41 updates the SOC by adding or subtracting a conduction current of the lithium-ion storage battery 11 to or from a previous value of the SOC.

At this time, the battery control apparatus 41 calculates the conduction current of the lithium-ion storage battery 11 by adding the consumed current determined at step S25 to the charge-discharge current determined at step S26. The battery control apparatus 41 then calculates the SOC. A function provided at step S28 corresponds to a "residual capacity calculating unit."

Then, at step S29, the battery control apparatus 41 determines whether or not the SOC calculated at step S28 is within a predetermined range. When determined that the SOC is within a predetermined range, the battery control apparatus 41 determines YES at step S29 and ends the process.

Meanwhile, when determined that the total cell voltage is not within the predetermined range at step S22, or when determined that an abnormality has occurred at step S27, at step S31, the battery control apparatus 41 outputs notification that an abnormality has occurred in the lithium-ion storage battery 11 to a display, a lamp, or the like that is mounted in the vehicle and displays the notification. Then, at step S32, the battery control apparatus 41 turns off the lithium battery switch 22 to stop power supply from the lithium-ion storage battery 11 to the cell monitoring apparatus 42.

In addition, when determined that the SOC is not within the predetermined range at step S29 as well, the battery control apparatus 41 determines that the state of charge of the lithium-ion storage battery 11 is not within a predetermined range. The battery control apparatus 41 turns off the lithium battery switch 22 to stop power supply from the lithium-ion storage battery 11 to the cell monitoring apparatus 42. A function provided at step S31 corresponds to a "switch control unit."

In addition, when determined that the lithium battery switch 22 is off due to an abnormality at step S21, at step S41, the battery control apparatus 41 acquires the state of the lithium-ion storage battery 11 from the cell monitoring apparatus 42 or the like. At this time, because power can be supplied from the lead storage battery 12 to the cell monitoring apparatus 42, the cell monitoring apparatus 41 can continue to monitor the lithium-ion storage battery 11 even when power is not supplied from the lithium-ion storage battery 11.

Then, at step S42, the battery control apparatus 41 determines whether or not the abnormality in the lithium-ion storage battery 11 is resolved. Specifically, when determined NO at step S22 (i.e., the total cell voltage is outside of the predetermined range in the previous period), the battery control apparatus 41 determines whether or not the total cell voltage is within the predetermined range. In addition, when determined YES at step S27 (i.e., an abnormality has occurred in the lithium-ion storage battery 11 in the previous period), the battery control apparatus 41 determines whether the abnormality is resolved.

Furthermore, when determined NO at step S29 (i.e., the SOC is outside of a predetermined range in the previous period), the battery control apparatus 41 calculates the charge-discharge current in a manner similar to that at step S26 and step S28. The battery control apparatus 41 calculates the SOC based on the calculated value of the charge-discharge current and determines whether or not the SOC is within the predetermined range.

When determined that the abnormality in the lithium-ion storage battery 11 is resolved (YES at step S42), at step S43, the battery control apparatus 41 turns on the lithium battery switch 22 and starts power supply from the lithium-ion storage battery 11 to the cell monitoring apparatus 42. The battery control apparatus 41 then ends the process. Meanwhile, when determined that the abnormality is not resolved, the battery control apparatus 41 ends the process.

In addition, when determined that the IG signal is off (NO at step S11), at step S51, the battery control apparatus 31 determines whether or not a current time is immediately after the IG signal has become off. When determined that the current time is immediately after the IG signal has become off (YES at step S51), at step S52, the battery control apparatus 41 performs a stop process thereof. In addition, when determined that the lithium battery switch 22 and the lead battery switch 25 are on, the battery control apparatus 41 turns off the lithium battery switch 22 and the lead battery switch 25, and stops power supply to the cell monitoring apparatus 42.

At step S51, when determined that the current time is not immediately after the IG signal has become off (NO at step S51), at step S61, the battery control apparatus 41 determines whether or not a predetermined amount of time has elapsed from a previous cell balancing process. When determined that the predetermined amount of time (such as an hour from a previous startup) has not elapsed (NO at step S51), the battery control apparatus 41 ends the process. When determined that the predetermined amount of time has elapsed (YES at step S51), at step S62, the battery control apparatus 41 turns on the lead battery switch 25 and starts power supply to the cell monitoring apparatus 42.

Here, the battery control apparatus 41 may not perform the determination at step S61. Rather, the ECU 51 may determine whether or not the predetermined amount of time has elapsed from the previous cell balancing process. The battery control apparatus 41 may then proceed to step S61 based on a command from the ECU 51.

Then, at step S63, the battery control apparatus 41 acquires the cell voltage of each battery cell 11a. At step S64, the battery control apparatus 41 determines whether or not the cell balancing process (equalization process for the battery cells 11a) is required based on the cell voltages of the battery cells 11a acquired at step S63.

Here, the cell monitoring apparatus 42 may determine whether or not the cell balancing process is required. The battery control apparatus 41 may then receive the result of the determination and determine whether or not the cell balancing process is performed. Then, when determined that the cell balancing process is not required (NO at step S64), at S71, the battery control apparatus 41 turns off the lead battery switch 25, stops power supply to the cell monitoring apparatus 42, and ends the process.

When determined that the cell balancing process is required (YES at step S64), at step S65, the battery control apparatus 41 turns on the lithium battery switch 22. At step S66, the battery control apparatus 41 turns off the lead battery switch 25. That is, the battery control apparatus 41 makes the lithium-ion storage battery 11 supply power to the cell monitoring apparatus 42. Then, at step S67, the battery control apparatus 41 performs the cell balancing process.

Subsequently, at step S68, the battery control apparatus 41 determines whether or not the cell balancing process has completed. When determined that the cell balancing process has completed (NO at step S68), the battery control apparatus 41 returns the process to step S68. That is, the battery control apparatus 41 continues to perform the cell balancing process until determined that the cell balancing process is completed. When determined that the cell balancing process has completed (YES at step S68), at step S69, the battery control apparatus 41 turns off the lithium battery switch 22, stops power supply to the cell monitoring apparatus 42, and ends the process.

Figure 3:
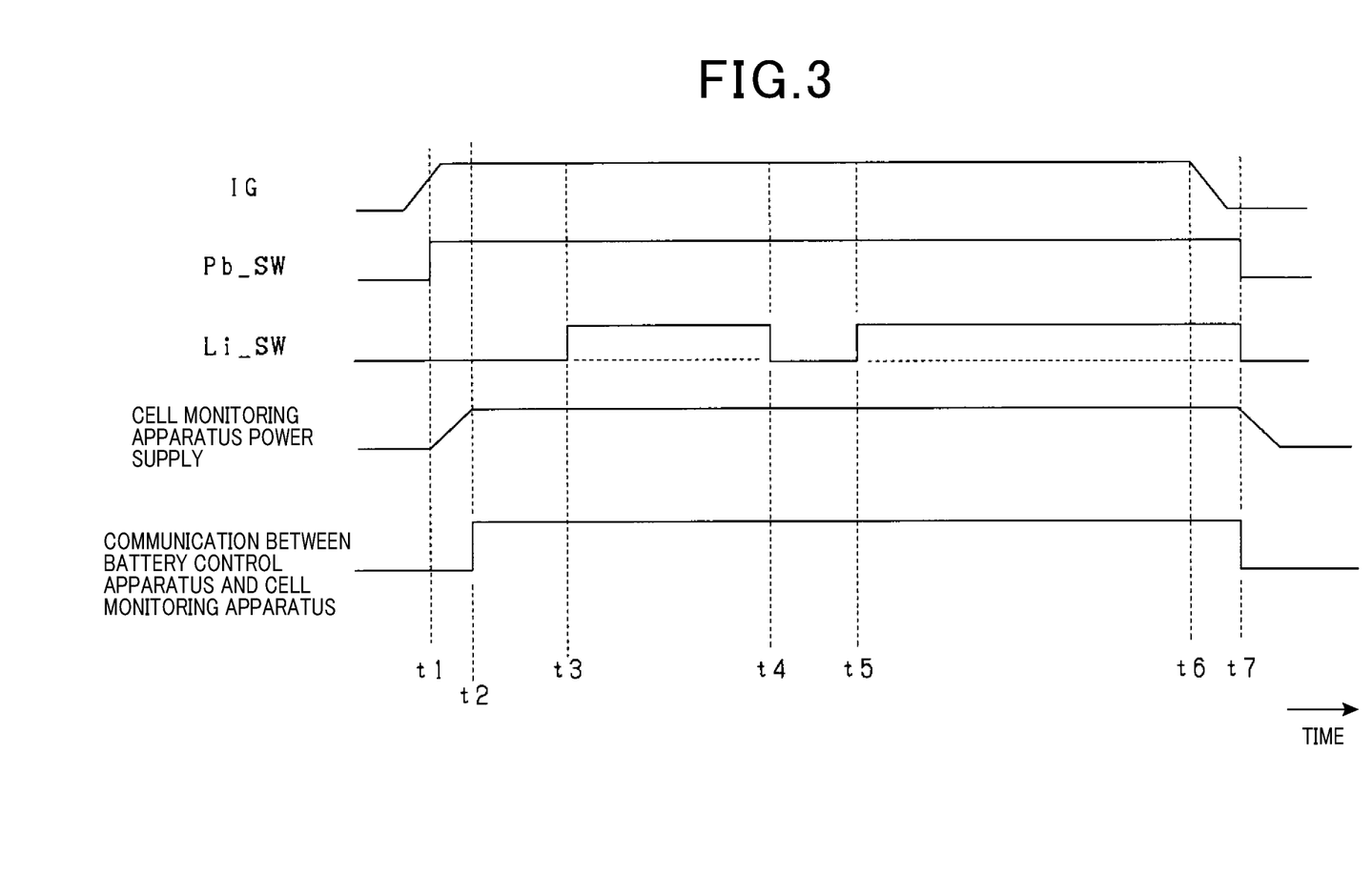
FIG. 3 is a timing chart of the process performed by the battery control apparatus.

FIG. 3 is a time chart that shows the above-described process performed by the battery control apparatus 41 from when the IG signal becomes on until the IG signal becomes off, in further detail. Here, a case in which an abnormality occurs in the lithium-ion storage battery 11 after the IG signal becomes on and is then resolved is assumed.

In FIG. 3, the IG circuit 52 is turned on. At timing t1, when a predetermined voltage is reached, the lead battery switch 25 is turned on based on a command from the battery control apparatus 41. Here, the lead battery switch 25 may be turned on as a result of the IG signal becoming on, rather than based on the command from the battery control apparatus 41. Then, when the lead battery switch 25 is turned on, power supply from the lead storage battery 12 to the cell monitoring apparatus 42 is started.

When the cell monitoring apparatus 42 is started, at timing t2, communication between the battery control apparatus 41 and the cell monitoring apparatus 42 is started. When the communication between the battery control apparatus 41 and the cell monitoring apparatus 42 is started at timing t2, the cell monitoring apparatus 42 measures the inter-terminal voltage of each battery cell 11a. The battery control apparatus 41 calculates the total cell voltage for all battery cells 11a based on the measured inter-terminal voltage of each battery cell 11a.

Then, when the total cell voltage is determined to be within the predetermined range, at timing t3, the lithium battery switch 22 is turned on. Power supply from the lithium-ion storage battery 11 and the lead storage battery 12 to the cell monitoring apparatus 42 is started.

Subsequently, at timing t4, the lithium battery switch 22 is turned off when an abnormality is determined to have occurred in the lithium-ion storage battery 11, such as the charge-discharge current being excessively large. At this time, because the lead battery switch 25 is turned on, power supply from the lead storage battery 12 to the cell monitoring apparatus 42 is continued. Then, at timing t5, when the abnormality in the lithium-ion storage battery 11 is resolved, the lithium battery switch 22 is turned on, and power is supplied from the lithium-ion storage battery 11 and the lead storage battery 12 to the cell monitoring apparatus 12.

Subsequently, at timing t6, when the IG circuit 52 is turned off, the battery control apparatus 41 performs the stop process. During the stop process by the battery control apparatus 41, at timing t7, the lithium battery switch 22 and the lead battery switch 25 are turned off. Power supply to the cell monitoring apparatus 42 is stopped. The cell monitoring apparatus 42 is stopped. In addition, communication between the battery control apparatus 41 and the cell monitoring apparatus 42 is stopped.

According to the present embodiment described in detail above, the following advantageous effects are achieved.

The electrical loads 13 and 14, the rotating electric machine 15, and the cell monitoring apparatus 42 are connected to the lithium-ion storage battery 11. However, during calculation of the SOC, if the SOC of the lithium-ion storage battery 11 is calculated while ignoring the current that is consumed by the cell monitoring apparatus 42, an error in the SOC occurs as a result.

Therefore, according to the present embodiment, the shunt resistor 21 is provided on the conduction path (electrical path L2) between the lithium-ion storage battery 11 and the cell monitoring apparatus 42. The consumed current that flows from the lithium-ion storage battery 11 to the cell monitoring apparatus 42 and is consumed by the cell monitoring apparatus 42 is calculated by the voltage of the shunt resistor 21 on the cell monitoring apparatus 42 side being acquired. In addition, the SOC of the lithium-ion storage battery 11 is calculated based on the consumed current and the charge-discharge current. As a result, a more accurate SOC can be calculated.

In addition, power is supplied to the battery control apparatus 41 over the electrical path L5 that branches off from between the shunt resistor 21 and the cell monitoring apparatus 42. As a result, the consumed current that flows to the battery control apparatus 41 and is consumed by the battery control apparatus 41 can be calculated together with the consumed current that is consumed by the cell monitoring apparatus 42.

Consequently, even when power is supplied from the lithium-ion storage battery 11 to the battery control apparatus 41, the SOC of the lithium-ion storage battery 11 can be accurately calculated. In addition, as a result of power being supplied to the battery control apparatus 41 from both the lithium-ion storage battery 11 and the lead storage battery 12, power supply to the battery control apparatus 41 can be made redundant. Reliability of the battery control apparatus 41 is improved.

As a result of power being supplied to the cell monitoring apparatus 42 from the lithium-ion storage battery 11 and the lead storage battery 12, reliability of the cell monitoring apparatus 42 is improved due to redundancy of the power supply. In addition, as a result of the two storage batteries 11 and 12 being used together, an amount of use of the lithium-ion storage battery 11 can be reduced. Furthermore, power supply to the cell monitoring apparatus 42 can be switched between power supply from the lead storage battery 12 and power supply from both storage batteries 11 and 12 based on the state of charge of the lithium-ion storage battery 11.

When an abnormality occurs in the lithium-ion storage battery 11, power supply from the lithium-ion storage battery 11 to the cell monitoring apparatus 42 is stopped by the lithium battery switch 22 being opened. Meanwhile, power is supplied to the cell monitoring apparatus 42 from the lead storage battery 21 by the lead battery switch 25 being kept closed. In this way, even when an abnormality occurs in the lithium-ion storage battery 11, power can be supplied from the lead storage battery 12. The cell monitoring apparatus 42 can continue to monitor the state of the lithium-ion storage battery 11.

The above-described embodiment may also be modified in the following manner. Configurations in the separate examples below may be individually applied or applied in arbitrary combinations to the configuration according to the above-described embodiment.

The power supply system is not limited to that including the lithium-ion storage battery 11 and the lead storage battery 12 as the first storage battery and the second storage battery, as according to the above-described embodiment. The power supply system may use only the first storage battery. In this case, if an abnormality occurs in the first storage battery, the first switch may be turned off, notification of the occurrence of an abnormality may be given, and the cell monitoring apparatus may be stopped.

The storage batteries used in the power supply system are not limited to the lithium-ion storage battery 11 and the lead storage battery 12. For example, a configuration using other secondary batteries, such as a nickel-hydrogen storage battery, is also possible. However, as the first storage battery, a secondary battery of which the battery cells require monitoring is preferably used.

According to the present embodiment, power is supplied from the lithium-ion storage battery 11 to the battery control apparatus 41. However, power may be supplied from only the lead storage battery 12. In addition, power may be supplied from only the lithium-ion storage battery 11 and not from the lead storage battery 12.

According to the present embodiment, when the IG circuit 52 is on, the lead battery switch 25 is on at all times. However, the lead battery switch 25 may be switched between on and off based on the states of charge of the lithium-ion storage battery 11 and the lead storage battery 12. For example, when the remaining charge of the lead storage battery 12 is low and the SOC of the lithium-ion storage battery 11 is sufficient, the lead battery switch 25 may be turned off. When the remaining charge of the lead storage battery 12 is sufficient, the lead battery switch 25 may be turned on.

According to the present embodiment, the shunt resistor 21 is provided between the connection point N4 and the lithium battery switch 22. However, the shunt resistor 21 may be provided between the lithium battery switch 22 and the voltage divider circuit 23. That is, regarding the shunt resistor 21, all that is required is that the shunt resistor 21 be provided on the conduction path after the branching to the electrical load 14 and the rotating electric machine 15, and before the connection point N7 that branches off to the battery control apparatus 41 or the cell monitoring apparatus 42. In addition, all that is required is that a configuration for detecting voltage, such as the voltage divider circuit 23, be provided in a position at which the voltage on the cell monitoring apparatus 42 can be detected.

According to the above-described embodiment, the rotating electric machine 15 that provides the power generation function and the powering function is used as the power generator. However, a modification may be made such that a power generator, such as an alternator that provides only the power generation function, is used.

What is claimed is:

1. A battery control apparatus that is applied to a power supply system,
the power supply system including
a storage battery that includes a plurality of battery cells,
an electrical apparatus that is connected to the storage battery, and
a cell monitoring apparatus that is connected to each battery cell of the storage battery and detects a voltage of each battery cell, the power supply system supplying power from the storage battery to the cell monitoring apparatus through a conduction path that is connected between the storage battery and the electrical apparatus, the battery control apparatus calculating a residual capacity of the storage battery based on a charge-discharge current during charge-discharge of the storage battery, the battery control apparatus comprising:
  a total cell voltage calculating unit that calculates a sum of the voltages of the battery cells detected by the cell monitoring apparatus as a total cell voltage;
  a voltage acquiring unit that acquires a voltage of the cell monitoring apparatus side of a resistor that is provided on the conduction path;
  a consumed current calculating unit that calculates a consumed current that is consumed by the cell monitoring apparatus based on the total cell voltage and the voltage acquired by the voltage acquiring unit; and
  a residual capacity calculating unit that calculates the residual capacity based on the charge-discharge current and the consumed current.

2. The battery control apparatus according to claim 1, wherein:
  the battery control apparatus is
    operated by power supplied from the storage battery, and
    connected to a branching path that branches off from the conduction path between the resistor and the cell monitoring apparatus.

3. The battery control apparatus according to claim 1, wherein:
  the power supply system includes a first storage battery that serves as the storage battery and a second storage battery other than the first storage battery, the first storage battery and the second storage battery being connected to the cell monitoring apparatus; and
  the battery control apparatus includes
    a first switch that is provided between the first storage battery and the cell monitoring apparatus,
    a second switch that is provided between the second storage battery and the cell monitoring apparatus, and
    a switch control unit that controls opening and closing of the first switch and the second switch based on a state of charge of at least either of the first storage battery and the second storage battery during a monitoring operation by the cell monitoring apparatus.

4. The battery control apparatus according to claim 2, wherein:
  the power supply system includes a first storage battery that serves as the storage battery and a second storage battery other than the first storage battery, the first storage battery and the second storage battery being connected to the cell monitoring apparatus; and
  the battery control apparatus includes
    a first switch that is provided between the first storage battery and the cell monitoring apparatus,
    a second switch that is provided between the second storage battery and the cell monitoring apparatus, and
    a switch control unit that controls opening and closing of the first switch and the second switch based on a state of charge of at least either of the first storage battery and the second storage battery during a monitoring operation by the cell monitoring apparatus.

5. The battery control apparatus according to claim 3, comprising:
  an abnormality determining unit that determines whether or not an abnormality has occurred in the first storage battery based on monitoring results from the cell monitoring apparatus, during the monitoring operation by the cell monitoring apparatus, wherein
  the switch control unit opens the first switch and closes the second switch when the abnormality determining unit detects an abnormality.

6. The battery control apparatus according to claim 4, comprising:
  an abnormality determining unit that determines whether or not an abnormality has occurred in the first storage battery based on monitoring results from the cell monitoring apparatus, during the monitoring operation by the cell monitoring apparatus, wherein
  the switch control unit opens the first switch and closes the second switch when the abnormality determining unit detects an abnormality.

7. A power supply system comprising:
  a first storage battery that includes a plurality of battery cells;
  a cell monitoring apparatus that is connected to each battery cell of the first storage battery and detects a voltage of each battery cell; and
  a battery control apparatus to which power is supplied from a second storage battery other than the first storage battery, the battery control apparatus calculating a residual capacity of the first storage battery based on a charge-discharge current during charge-discharge to an electrical apparatus that is connected to the first storage battery, wherein
  the first storage battery is connected to the cell monitoring apparatus and the battery control apparatus via a resistor that is provided on a conduction path that branches off from an electrical path to the electrical apparatus, and
  the battery control apparatus includes
    a total cell voltage calculating unit that calculates a sum of the voltages of the battery cells detected by the cell monitoring apparatus as a total cell voltage;
    a voltage acquiring unit that acquires a voltage of the resistor on the cell monitoring apparatus side;
    a consumed current calculating unit that calculates a consumed current that is consumed by the cell monitoring apparatus and the battery control apparatus based on a difference between the total cell voltage and the voltage acquired by the voltage acquiring unit; and
    a residual capacity calculating unit that calculates the residual capacity based on the charge-discharge current and the consumed current.

8. The power supply system according to claim 7, wherein:
  the first storage battery and the second storage battery are connected to the cell monitoring apparatus; and
  the battery control apparatus includes
    a first switch that is provided between the first storage battery and the cell monitoring apparatus,
    a second switch that is provided between the second storage battery and the cell monitoring apparatus, and a switch control unit that controls opening and closing of the first switch and the second switch based on a state of charge of at least either of the first storage battery and the second storage battery during a monitoring operation by the cell monitoring apparatus.

* * * * *